(12) United States Patent
Khachaturov (10) Patent No.: US 11,503,746 B2
(45) Date of Patent: Nov. 15, 2022

(54) VARIABLE FREQUENCY DRIVE AND METHOD OF ITS AIR COOLING

(71) Applicant: Dmytro Khachaturov, Kharkov (UA)

(72) Inventor: Dmytro Khachaturov, Kharkov (UA)

( * ) Notice: Subject to any disclaimer, the term of this patent is extended or adjusted under 35 U.S.C. 154(b) by 0 days.

(21) Appl. No.: 16/900,904

(22) Filed: Jun. 13, 2020

(65) Prior Publication Data

US 2020/0392952 A1 Dec. 17, 2020

(30) Foreign Application Priority Data

Jun. 14, 2019 (UA) ............................. a 2019 06697

(51) Int. Cl.
*H05K 7/20* (2006.01)

(52) U.S. Cl.
CPC ......... *H05K 7/20918* (2013.01); *H05K 7/206* (2013.01); *H05K 7/20145* (2013.01)

(58) Field of Classification Search
CPC ..... H05K 7/20136–2019; H05K 7/202; H05K 7/20909–20918; H05K 7/206; F04B 39/066
USPC ................................................ 361/695–697
See application file for complete search history.

(56) References Cited

U.S. PATENT DOCUMENTS

| | | | | |
|---|---|---|---|---|
| 6,494,252 B1* | 12/2002 | Takala | ................... | H05K 7/206 165/104.33 |
| 6,598,668 B1* | 7/2003 | Cosley | ................... | H05K 7/206 165/104.32 |
| 6,877,551 B2* | 4/2005 | Stoller | ................... | H02B 1/565 165/122 |
| 7,108,052 B2* | 9/2006 | Giacoma | ............... | F28D 9/0025 165/104.34 |
| 9,485,889 B2* | 11/2016 | Broussard | .......... | H05K 7/20509 |
| 9,819,159 B2* | 11/2017 | Smith | ........................ | G01F 1/05 |
| 9,974,214 B2* | 5/2018 | Hamah | ............... | H05K 7/20909 |
| 10,197,052 B2* | 2/2019 | Felix | ........................ | F04B 49/20 |
| 10,212,861 B2* | 2/2019 | Ashbaugh | .......... | H05K 7/20909 |
| 10,462,938 B2* | 10/2019 | Wan | ..................... | H05K 7/20572 |
| 10,537,046 B1* | 1/2020 | Ledezma | ................. | H02P 27/08 |
| 10,617,043 B2* | 4/2020 | Ionescu | .............. | H05K 7/20572 |
| 2012/0298341 A1* | 11/2012 | Fernandez | .............. | H04Q 1/025 165/121 |
| 2017/0188482 A1* | 6/2017 | Stockdale | .......... | H05K 7/20918 |

(Continued)

*Primary Examiner* — Zachary Pape (57) ABSTRACT

A forced double-circuit air cooling system designed for using in a sealed cabinet structure. A first air circuit is formed by an air loop moved around each of local modules (3; 4) of a sealed compartment [2] with using a circulation fan (26) which is installed within a sealed air channel [28]. The first air circuit is formed within an internal air channel (18) of the sealed compartment [2]. Wherein the internal air channel is connected to a number of air heat exchangers [22]. A first pair [22.1] of said number of air heat exchangers is equipped with the circulation fan [26]. Wherein a second air circuit [25] contains straight air channels [23] arranged within the ventilated compartment [24] adjacent to the sealed compartment [2]. Each of said straight air channels [23] comprising a second pair [22.2] of air heat exchangers with a blast fan [27] between them.

10 Claims, 5 Drawing Sheets

(56) References Cited

U.S. PATENT DOCUMENTS

2020/0340404 A1\* 10/2020 Stockstill ................. F02C 7/20
2020/0392952 A1\* 12/2020 Khachaturov .......... F04B 39/06

\* cited by examiner

Fig.7 though the United States of America

VARIABLE FREQUENCY DRIVE AND METHOD OF ITS AIR COOLING

CROSS-REFERENCES TO RELATED APPLICATIONS

The present patent application claims priority to Ukrainian patent application a201906697 filed Jun. 14, 2019.

Field of the Invention

The claimed invention relates to the field of electrical engineering, particularly to the fields of frequency drive (FD) and converter equipment with a forced air cooling system designed for using in medium-voltage/high-voltage frequency drives and other electrical equipment with cabinet structures.

BACKGROUND OF THE INVENTION

Description of the Related Art

Currently known methods and systems for air cooling of high-voltage electrical equipment. Such equipment emits significant dissipated energy in a form of heat. It is well known, the prior art air cooling systems are designed for removing the emitted heat through both of natural and forced ventilation (cooling) methods.

Forced air cooling systems usually made in a form of a sealed enclosure with a double-circuit cooling system, wherein an internal circuit is sealed and connected to an external ventilated circuit through a heat exchanger.

Depending on the type of used refrigerant of cooling systems, for example liquid, air or mixed. Each of used refrigerant types has its own advantages and disadvantages depending on operating conditions.

The forced air cooling system is one of the most common, due to the relative simplicity of design and its usage. The main task of this technology area is the design of a sealed cabinet with reduced dimensions, simplified structure, increased maintainability and operational characteristics.

Patent application WO2013064211 sets out a test container comprises a rectangular parallelepiped disposed therein electrical components of the transformer testing system. The testing system in the test mode is designed as a corresponding heat source and a cooling system, with at least one heat exchanger. There is a moving device by means of which, at least one heat exchanger can move from a transport position inside the container to an operating position, which is located at least partially outside the container.

The known invention makes possible particularly simple transportation, assembling and disassembling of the test system and prevent using of a rotary converter.

The disadvantages of the described invention comprising increasing dimensions in the test mode and a presence of flexible connection of heat exchangers which can leading to a failure and violation of the tightness of the sealed air circuit.

Utility model patent RU144730 sets out a method for cooling of a transformer compartment of a high-voltage electrical device, wherein used four tangential fans which are installed in a lower part of a multi-winding transformer cabinet. Mentioned fans are installed on doors of the multi-winding transformer cabinet, and provide a cooling air into the cabinet.

The disadvantages of the described technical solutions comprising a large number of fans, which leads to the increasing of dimensions of the cabinet.

Also, the U.S. Pat. No. 9,545,037B2 teaches the systems and the methods of cooling electric drives wherein an enclosure forming two or more sealed compartments. Each of the two or more sealed compartments prevents external air outside of the two or more sealed compartments from entering two or more sealed compartments. Two or more air-to-air heat exchangers adjacent to a respective one of two or more sealed compartments. Wherein the air-to-air heat exchangers cooling internal air within each of the sealed compartments without allowing entering the external air. Wherein a duct is adjacent to the sealed compartments and air-to-air heat exchangers are positioned within the duct. The external air flows through the duct and through each of air-to-air heat exchangers. The duct has at least one wall in common with two or more sealed compartments, wherein the sealed compartments are positioned in the thermal contact with the at least one common wall. Wherein each of said heat exchangers further comprising a plurality of plates.

The disadvantage of the described method is a scheme of an air flow according to which, a heated air is entering to the heat exchangers after the radiator, thereby reducing the efficiency of the heat exchanger and the cooling system at all.

Patent CN203416157(U) 29 Jan. 2014 teaches a cabinet for medium and high voltage frequency converters with a circulation cooling system. The cabinet is made as a monoblock case and comprises power and low-current electronic components placed in at least one sealed compartment with a double-circuit forced air cooling system with at least one air heat exchanger.

Wherein the method of forced air cooling comprising:
forming of a circulation channel,
implementation of forced air circulation through heat exchangers. A first heat exchange is made within an internal circuit of the frequency converter, then a second heat exchange is made within the heat exchanger. The heat exchanger contains three independent channels, namely: a heat exchange channel, a cold air channel and a hot air channel.

Disadvantage of the described invention is separation of air flow into two parts inside the cabinet, which leads to the usage of an additional recirculation fan inside the cabinet to obtain the air flow of the sufficient density with a required flow rate and speed.

The claimed technical solution aims solving a technical problems of the prior art.

SUMMARY OF THE INVENTION

A technical result of the claimed invention is an improving of maintainability, as well as increasing of ergonomic characteristics of a sealed compartment of a variable frequency drive (VFD) with increased efficiency dual-circuit forced air cooling system.

The variable frequency drive comprising:
a cabinet with a double-circuit forced air cooling system, a power and low-current electronic components, a control unit. Wherein said cabinet contains sealed and ventilated compartments. Wherein said sealed compartment comprising a first air circuit, local modules with a power and low-current electronic components. Wherein the ventilated compartment comprising a second air circuit.

Said first air circuit and second air circuit are designed in thermal communication via a number of air heat exchangers installed within the ventilated compartment. The first air circuit arranged within the sealed compartment and configured as an internal air channel which is formed around of a perimeter of each local module of the sealed compartment and equipped with a circulation fan.

Said internal air channel connected to the number of air heat exchangers. Wherein each first pair of air heat exchangers is equipped with the circulation fan, and a second pair of air heat exchangers is equipped with blast fan.

The second air circuit contains straight air channels arranged within the ventilated compartment adjacent to the sealed compartment, wherein each of said straight air channels comprising one pair of the number of air heat exchangers with the blast fan between them.

A method of air cooling of the variable frequency drive which is based on above described structure comprising:
forming a double-circuit forced air cooling system;
arranging the first air cooling circuit within the sealed compartment of the variable frequency drive cabinet;
arranging the second air cooling circuit within the ventilated compartment of the variable frequency drive cabinet;
separating the sealed compartment by local modules with the power and low-current electronic components;
forming an internal air channels around of a perimeter of each local module of the sealed compartment,
forming a cooling air barrier between the cabinet enclosure and each local module of the sealed compartment.

A variable frequency drive (FIG. 1) is made in a monoblock cabinet which is designed as a rectangular parallelepiped with openings for doors, sealed terminal chambers and assembly covers of cooling system elements. The cabinet enclosure 1 is divided by two longitudinal compartments. The cabinet 1 is designed with a double-circuit forced air cooling system.

Figure 2:
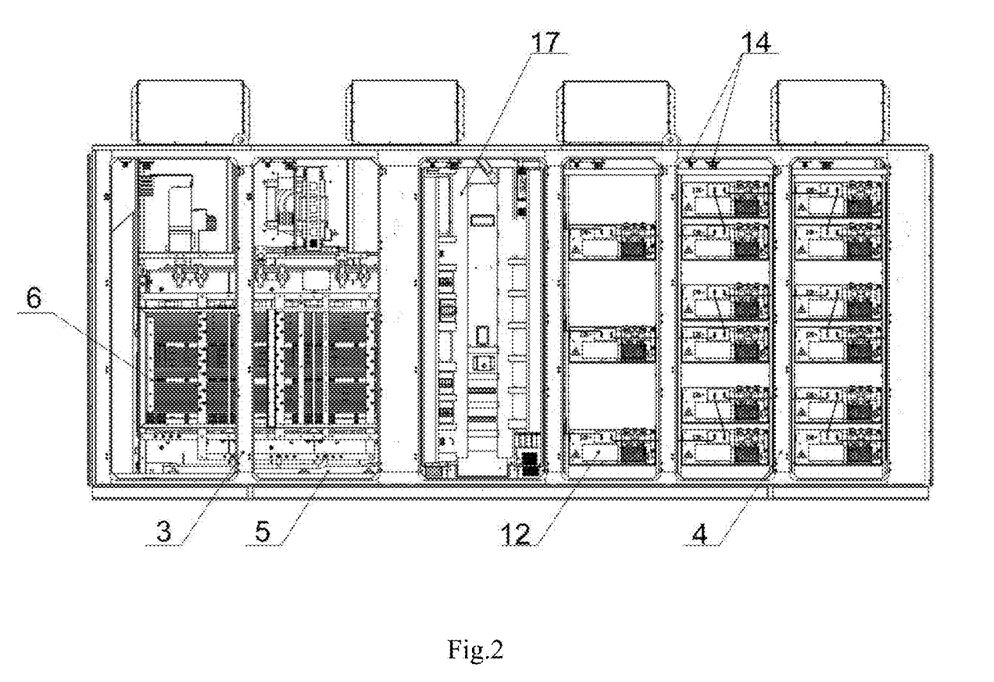
FIG. 2—illustrates a side view of the VFD cabinet.

One of said compartments is sealed 2 and comprises a first air circuit (an internal cooling circuit) and local (separated) modules 3; 4 (FIG. 2) with power and low-current electronic components.

Local module 3 is designed for a transformer. Wherein the transformer 6 (FIG. 3) is installed on a movable frame 5. According to present invention the transformer 6 is designed as dry-type transformer, also it can be designed as another well-known type of a transformer.

Figure 3:
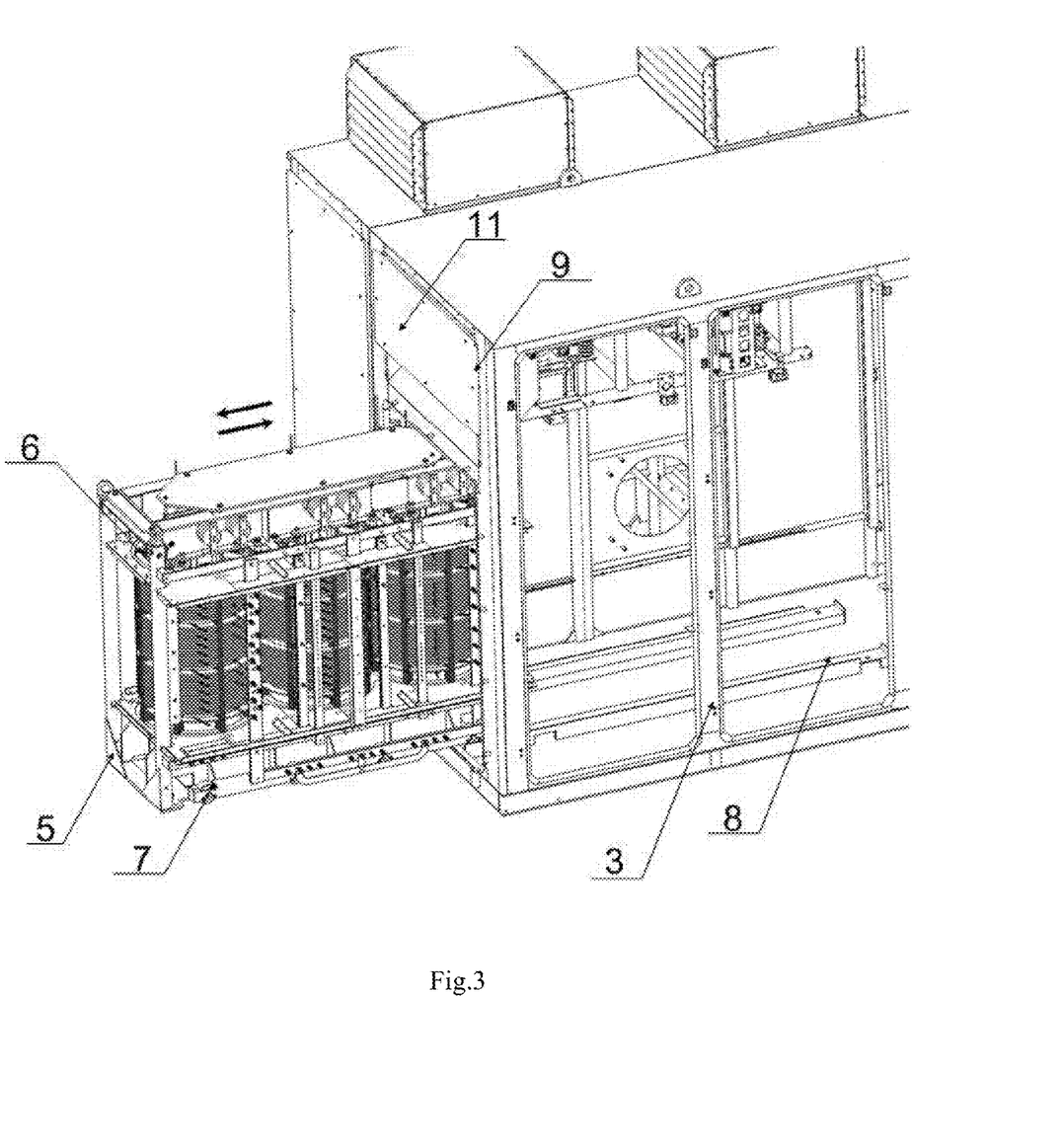
FIG. 3—illustrates a transformer module of the VFD.

The movable frame 5 comprising a roller frame 7 with guiding ways (rails) 8. Described structure allows removing the transformer 6 out of the cabinet 1 during a maintenance.

One of the side walls 9 of the cabinet is equipped with an assembly cover 10 of the transformer 6 for servicing the transformer and provide the access to an internal air channel 18 of the local module 3.

In an operation condition, the assembly cover 10 is hermetically closed. A first sealed terminal chamber 11 of external connections is installed upper then the assembly cover 10. Said first terminal chamber 11 also could be made in a form of a separate modular switching cell.

The local module 4 comprising a number of power cells 12 (FIG. 2) of the VFD wherein said power cells are installed on an electrically secured frame made of polymer material. Also said power cells are designed for using bypass switching devices. For example, mechanical switch device based on vacuum chamber, for example high operated communication device (HOpCoD).

Figure 4:
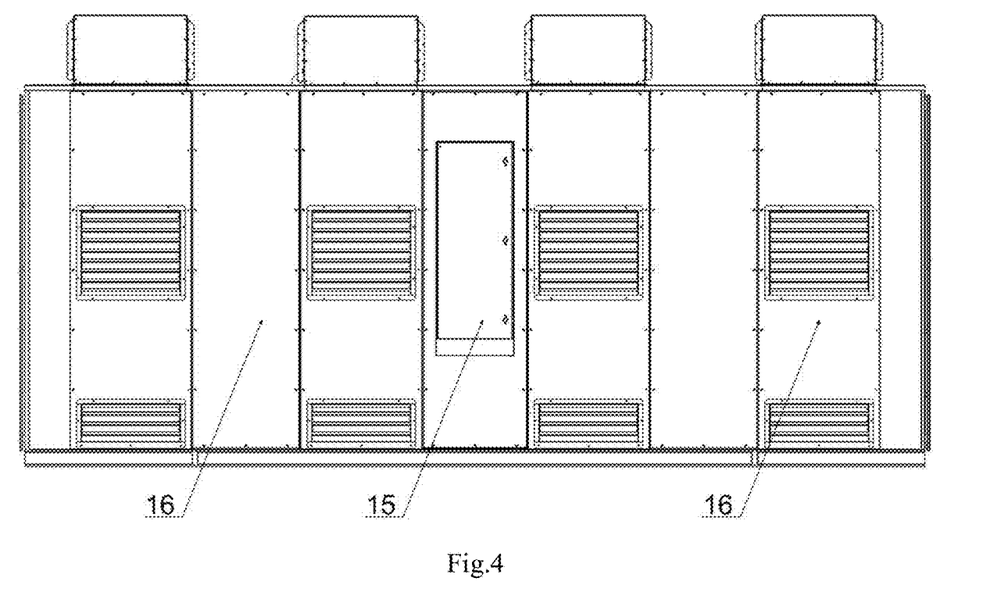
FIG. 4—illustrates a back side view of the VFD cabinet.

An access to the local module 4 is realized through sealed doors 13 (FIG. 1) installed on a front side of the cabinet.

Wherein an another side (back side) of the cabinet 1 illustrated in (FIG. 4) comprising a second sealed terminal chamber 15 and assembly covers 16 of the cooling system elements, such as fans 26; 27 and heat exchangers 22.

The specified design allows increasing maintainability and simplicity of usage of the VFD.

According to the variant of variable frequency drive implementation the control unit is cased in a separate (local) module 17 (FIG. 2) which is installed between two adjacent local modules 3; 4 of the sealed compartment 2 within the internal air channel 18. The control unit module 17 is designed in a trapezoidal shape, which is ventilated from three sides. Said control unit module 17 is installed on a direction of a cooling air within the internal air channel 18 of the sealed compartment 2.

Figure 1:
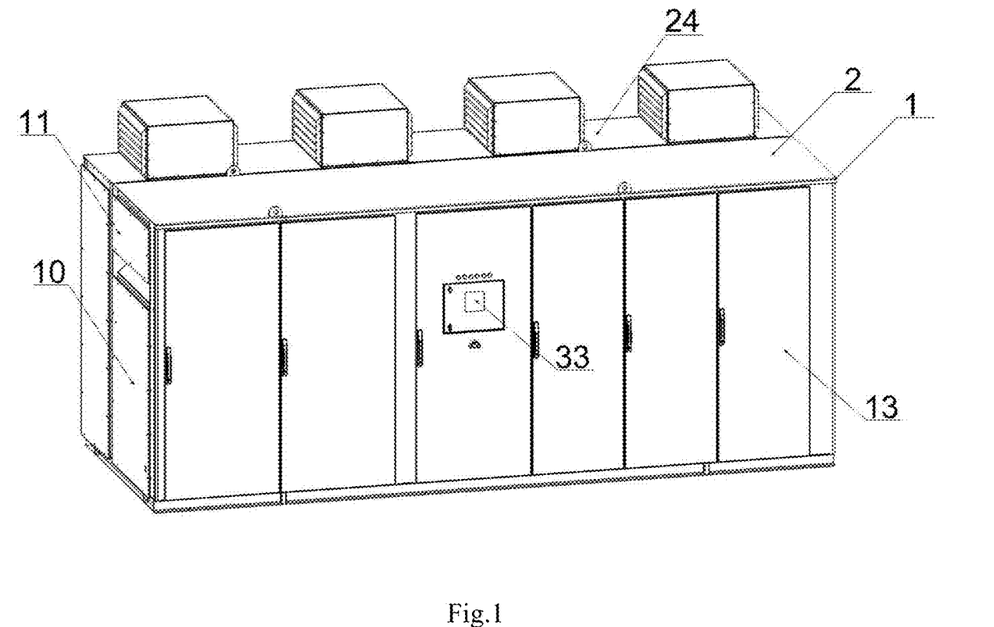
FIG. 1—illustrates a general view of the variable frequency drive cabinet (VFD)

Walls of the trapezoidal shaped control unit module 17 allow installation of low current electronic components of control unit as well as integrated microprocessor controller 33 (FIG. 1). The walls of the control unit module 17 are designed as radiators for law current electronic components.

Described design allows forming an efficient cooling of the control unit without using additional fans and radiators.

Figure 5:
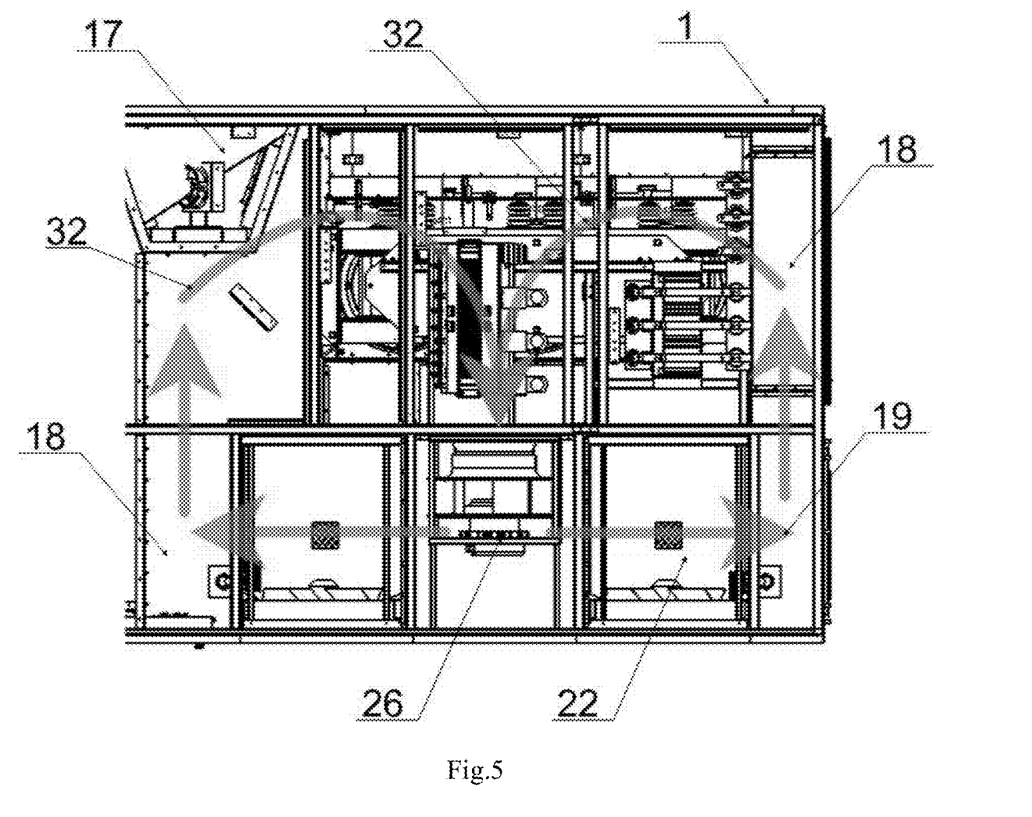
FIG. 5—illustrates the double-circuit forced air cooling system.

The first air circuit arranged within the sealed compartment 2 is configured within the internal air channel 18 (FIG. 5) which is formed around of a perimeter of each local module 3; 4 of the sealed compartment 2. Wherein the internal air channel 18 is connected to a number of air heat exchangers 22 and formed as an air barrier between the cabinet enclosure 1 and each local module 3; 4 of the sealed compartment 2. Said air barrier is formed by a cooling air 19 of the first air circuit 32 and allows to protect internal power and law-current electronic components against influence of an external high temperature.

The internal air channel 18 of the sealed compartment 2 contains thermoelectric devices with additional radiators 20 (FIG. 6) of an air dehumidification system. Said thermoelectric devices are designed for removing moisture out of the sealed compartment without violating a tightness of the sealed compartment 2.

Radiators 20 (FIG. 6) are installed within a second air circuit 25 on a direction of an external air flow 21.

The air dehumidification system also could be equipped with the additional electric air heaters (not shown in the drawings) installed within the sealed compartment 2.

The internal air channel 18 connected to the number of air heat exchangers 22. According to the present variant of the invention the sealed compartment 2 comprising at least two adjacent local modules 3; 4 and the control unit module 17.

Figure 6:
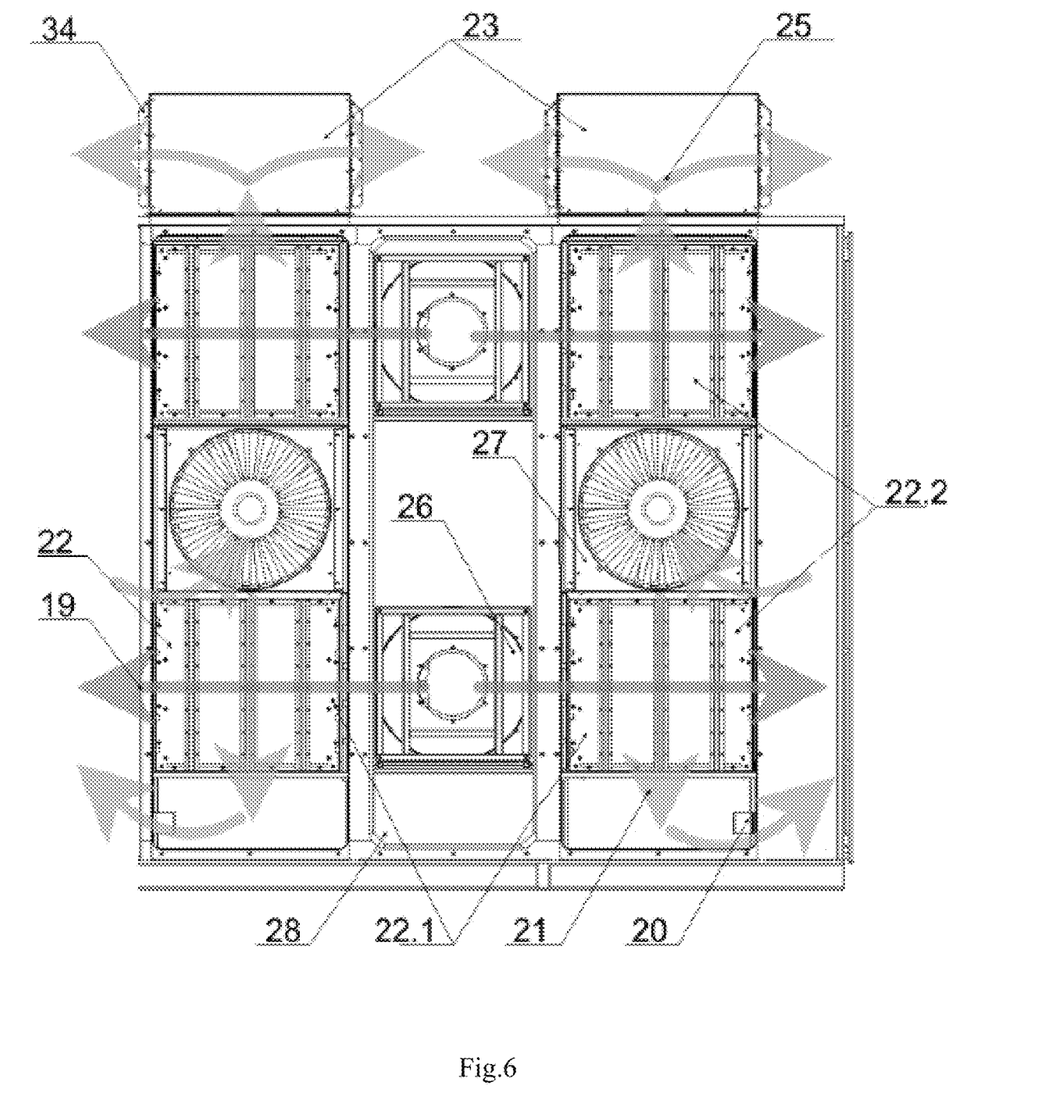
FIG. 6—illustrates air heat exchangers positioning.
Figure 7:
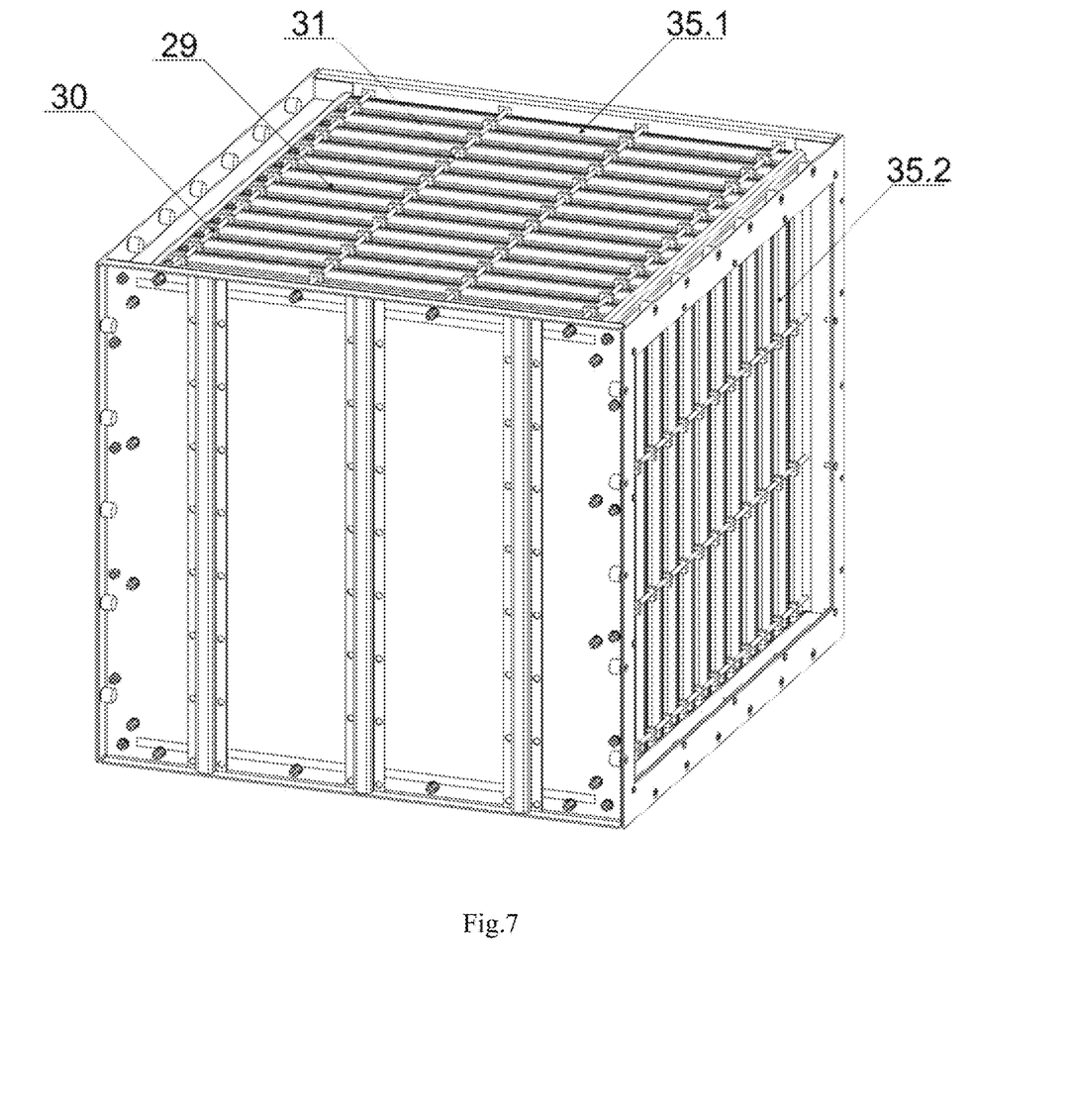
FIG. 7—illustrates the air heat exchanger structure.

Each of local module 3; 4 comprising at least two pairs of air heat exchangers 22 (FIG. 6 and FIG. 7). Said air heat exchangers 22 are installed within vented straight air channels 23, arranged within [[the]] a ventilated compartment 24 (FIG. 1). The ventilated compartment 24 is an adjacent to the sealed compartment 2. Both of said straight air channels 23 and the number of air heat exchangers 22 are forming the second air circuit (an external cooling circuit).

Each pair of said number of air heat exchangers 22 is equipped with at least one fan. Wherein a first pair 22.1 of heat exchangers is equipped with a circulation fan 26. Said circulation fan 26 is integrated into the first air circuit. Wherein at least one circulation fan 26 is installed within a sealed air channel 28 arranged between the heat exchangers 22 of the first pair 22.1. Also at least one circulation fan 26 is aligned with air ways of heat exchangers of each first pair 22.1 of air heat exchangers 22.

A second pair 22.2 of air heat exchangers 22 is equipped with a blast fan 27 between them. The blast fan 27 is integrated into the second air circuit 25 and arranged within straight air channels 23 as well as the second pair 22.2 of air heat exchangers.

Each of heat exchangers 22 consists of laminated sandwiched plates 29 (FIG. 7). Said laminated sandwiched plates 29 comprising metal plates with a polymer sandwiched layer between them. Wherein the laminated sandwiched plates 29 separated by spacing elements 30 installed periodically and connected by coupling rods 31 installed around the perimeter of the heat exchanger 22.

Each of heat exchangers 22 contains at least two separated air ways 35.1; 35.2, one of which is orthogonal to another, wherein said two air ways configured between of each three neighboring laminated sandwiched plates 29. Said spacing elements 30 forming the orthogonal air ways for providing the first and the second air circuits. Wherein the orthogonal air ways are designed to prevent mixing of air flows of the first and the second air circuits.

The straight air channels 23 (FIG. 6) are equipped with vents 34.

A method of forced air cooling of the sealed compartment 2 of the VFD according to present invention directly depends on the described structure of the VFD and can be provided by using features of the invention with an achievement of said technical result.

According to the present method, the system of forced air cooling of the sealed compartment of the VFD is designed with the double air cooling circuit. Wherein the first circuit 32 is sealed and designed as the internal cooling circuit of the sealed compartment 2. The sealed compartment 2 of the VFD is designed according to the class of standards IP58 or NEMA4. The second air circuit 25 is designed within the ventilated compartment 24 of the variable frequency drive cabinet 1 and forming the external cooling circuit.

The first and the second air cooling circuits are designed in the thermal communication via the number of air heat exchangers 22 installed within the ventilated compartment 24.

The first air circuit 32 is formed by an air loops moving around and through of each of local modules 3; 4 of the sealed compartment 2 by an influence of the circulation fan 26. Describes structure of local modules 3; 4 allows to provide the cooling air barrier between the cabinet enclosure 1 and each of local module of the sealed compartment by the internal air channel 18.

During the operation of the VFD providing a step of an air fans capacity control via the control unit module 17 depending on the air temperature within the sealed compartment or each of local modules which is measured by sensors 14.

Also, before start of the VFD, providing a step of detecting an air humidity inside of the sealed compartment 2. Draining the air by its heating until the moisture will collect on thermoelectric devices installed in the internal air channels 18. After that, removing collected moisture out of the sealed compartment without violating tightness of the sealed compartment.

A control of internal components of the VFD is provided on the basis of a programmable microprocessor controller 33 installed in the control unit module 17. The control unit module 17 is cased in the separate trapezoidal housing, Wherein the separate trapezoidal housing is installed within the air channel 18, between the modules 3; 4 of the sealed compartment 2.

The claimed invention allows to achieve the specified benefits and advantages, providing optimal dimensions and tightness of the VFD. Improving ergonomics, as well as effectiveness of forced air cooling of electronic components placed within the sealed compartment with providing protection against moisture and dust according to the standard not lower than NEMA4 or IP58, by special structure of the double circuit air cooling system.

What is claimed is:

1. A variable frequency drive air cooling system comprising:
    a cabinet [1], a double-circuit forced air cooling system, power and low-current electronic components, a control unit;
        wherein said cabinet contains a sealed compartment [2] and a ventilated compartment [24];
        the sealed compartment [2] comprising a first air circuit [32], local modules [3; 4; 17] with the power and the low-current electronic components;
        the ventilated compartment [24] comprising a second air circuit [25];
        wherein said first air circuit [32] and the second air circuit [25] are designed in thermal communication via a number of air heat exchangers [22] installed within the ventilated compartment [24], and
        the first air circuit [32] is arranged within the sealed compartment [2] and formed by an internal air channel [18] which is formed around a perimeter of each of the local modules [3;4; 17] of the sealed compartment [2];
        wherein each of the local modules [3;4] is equipped with a circulation fan [26] installed within a sealed air channel [28];
        wherein the sealed air channel [28] is arranged within the ventilated compartment [24] between air heat exchangers [22] of a first pair [22.1] which are installed within straight air channels [23];
        wherein the internal air channel [18] is connected to the first pair [22.1] of air heat exchangers [22] and formed as an air barrier between the cabinet enclosure and each of the local modules [3; 4] of the sealed compartment;
        wherein the first pair [22.1] of said number of air heat exchangers [22] is equipped with the circulation fan [26];
        wherein the second air circuit [25] contains the straight air channels [23] arranged within the ventilated compartment [24] adjacent to the sealed compartment [2],
            wherein each of said straight air channels [23] comprising a second pair [22.2] of air heat exchangers [22] with a blast fan [27] between them.

2. The variable frequency drive of claim 1 wherein the cabinet [1] is designed with a four sides access,
    wherein a front side of the cabinet [1] is equipped with sealed doors [13] of each local module of the sealed compartment [2], as well as a control unit module [17] with an integrated microprocessor controller [33],
    wherein one of said local modules of the sealed compartment contains a transformer [6],
    wherein one of said local modules of the sealed compartment contains a number of power cells [12], wherein other sides of the cabinet [1] comprising a sealed terminal chamber [11; 15] and assembly covers [16] of the circulation fan [26] and the blast fan [27] and the air heat exchangers [22].

3. The variable frequency drive of claim 1 wherein one of side walls of the cabinet [1] is equipped with the transformer assembly cover [10].

4. The variable frequency drive of claim 1 wherein at least one circulation fan [26] is installed within the sealed air channel [28] arranged between the air heat exchangers [22] of the first pair [22.1],
   wherein the at least one circulation fan [26] is aligned with air ways [35.2] of the air heat exchangers [22] of the first pair [22.1].

5. The variable frequency drive of claim 1 wherein each of the air heat exchangers [22] consists of laminated sandwiched plates [29] comprising metal plates with a polymer sandwiched layer between them,
   wherein the laminated sandwiched plates [29] is divided by spacing elements [30] installed periodically and connected by coupling rods [31] installed around of the perimeter of the heat exchanger.

6. The variable frequency drive of claim 1 wherein each of the air heat exchangers contains at least two divided air ways [35.1; 35.2], one of which is orthogonal to another,
   wherein said two air ways [35.1; 35.2] are configured between each three neighboring laminated sandwich plates [29].

7. The variable frequency drive of claim 1 wherein the control unit is cased in the local module [17] and installed between two adjacent local modules [3; 4] of the sealed compartment [2] within the internal air channel [18].

8. A variable frequency drive air cooling method comprising:
   forming a double-circuit forced air cooling system;
   arranging a first air circuit [32] within a sealed compartment [2] of the variable frequency drive cabinet [1];
   providing a second air circuit [25] within a ventilated compartment [24] of the variable frequency drive cabinet [1];
   wherein said first and second air circuit [32; 25] are designed in a thermal communication via a number of air heat exchangers [22] installed within the ventilated compartment [24];
   dividing the sealed compartment [2] by local modules [3; 4] with a power and low-current electronic components;
   forming an internal air channels [18] around of a perimeter of the local modules [3; 4:] of the sealed compartment [2],
      wherein each local module [3; 4] is equipped with at least one circulation fan [26];
   positioning the circulation fan [26] within a sealed air channel [28], and
   forming the sealed air channel [28] within the ventilated compartment [24] between air heat exchangers [22] of a first pair [22.1] which are installed within straight air channels [23],
   wherein the circulation fan [26] is aligned with air ways [35.2] of the air heat exchangers of the first pair [22.1];
   forming an air loop which is moving within each of the local modules [3; 4] with using the circulation fan [26], and
      forming a cooling air barrier between the cabinet [1] enclosure and each local module [3; 4] of the sealed compartment [2];
   directing the air loop of each local module [3; 4] through the air heat exchangers [22], and
      installing the air heat exchangers in a second pair [22.2] within one of the straight air flow channel [23] arranged within the ventilated compartment [24] which is adjacent to the sealed compartment [2],
      wherein each pair [22.2] of air heat exchangers comprising a blast fan [27].

9. The method of the air cooling of the variable frequency drive of claim 8 wherein controlling the capacity of the circulation and/or blast fan via a control unit depending on temperature within the sealed compartment [2] of each of the local modules [3; 4;].

10. The method of the air cooling of the variable frequency drive of claim 8 wherein detecting an air humidity inside of the sealed compartment [2],
   removing moisture from the air by collecting the moisture on thermoelectric devices installed in the internal air channels [18].

* * * * *